United States Patent
Fjelstad et al.

(10) Patent No.: US 7,279,783 B1
(45) Date of Patent: Oct. 9, 2007

(54) PARTITIONED INTEGRATED CIRCUIT PACKAGE WITH CENTRAL CLOCK DRIVER

(75) Inventors: Joseph C. Fjelstad, Maple Valley, WA (US); Kevin P. Grundy, Fremont, CA (US); Para K. Segaram, Brookfield (AU); Thomas J. Obenhuber, deceased, late of San Francisco, CA (US); by Inessa Obenhuber, legal representative, San Francisco, CA (US)

(73) Assignee: Silicon Pipe, Inc., San Jose, CA (US)

( * ) Notice: Subject to any disclaimer, the term of this patent is extended or adjusted under 35 U.S.C. 154(b) by 157 days.

(21) Appl. No.: 10/977,355

(22) Filed: Oct. 29, 2004

Related U.S. Application Data

(60) Provisional application No. 60/515,843, filed on Oct. 29, 2003.

(51) Int. Cl.
*H01L 23/02* (2006.01)
*H01L 23/34* (2006.01)
*H01L 23/48* (2006.01)
*H01L 23/52* (2006.01)

(52) U.S. Cl. .................. 257/686; 257/723; 257/784; 257/691; 257/E23.141

(58) Field of Classification Search ............. 257/777, 257/723, 692, 698, 691, E23.141, 686, 784
See application file for complete search history.

(56) References Cited

U.S. PATENT DOCUMENTS

| 5,760,487 | A * | 6/1998 | Kimura et al. ............... 290/48 |
| 6,005,778 | A * | 12/1999 | Spielberger et al. ......... 361/770 |
| 6,777,799 | B2 * | 8/2004 | Kikuma et al. ............. 257/686 |
| 2003/0141582 | A1 * | 7/2003 | Yang et al. ................. 257/686 |
| 2005/0051887 | A1 * | 3/2005 | Siniaguine ................. 257/691 |
| 2005/0139985 | A1 * | 6/2005 | Takahashi ................... 257/698 |

FOREIGN PATENT DOCUMENTS

JP 359127856 * 7/1984 ............. 25/4

* cited by examiner

*Primary Examiner*—Nitin Parekh
(74) *Attorney, Agent, or Firm*—Ronald R. Shea

(57) ABSTRACT

Disclosed are IC partitioned packaging and interconnection constructions that provide for improved distribution of power, ground, cross chip interconnections and clocks.

12 Claims, 3 Drawing Sheets

PARTITIONED INTEGRATED CIRCUIT PACKAGE WITH CENTRAL CLOCK DRIVER

CROSS-REFERENCE TO RELATED APPLICATIONS

This application claims priority from, and hereby incorporates by reference, U.S. Provisional Application No. 60/515,843, filed Oct. 29, 2003 and entitled: "Partitioned Integrated Circuit Package with Central Clock Driver."

FIELD OF THE INVENTION

The present invention relates to the field of electronic interconnections and IC packaging technology and semiconductor design architecture.

BACKGROUND

The current state of semiconductor lithography has enabled electrical circuits on a scale which has been unthinkable even a few years ago. As semiconductor chip features shrink into the nanometer range, overall integrated circuit performance becomes limited by numerous factors among them are cross chip routes, on-chip clock skew and power and ground distribution. Moreover, as IC chips get larger with greater numbers of transistors, they require more signal routing, more I/O and more power to operate. Thus with such a large quantity of circuit elements, the challenges of delivering common signals and power to millions of circuit elements, has become a significant impediment to increasing overall chip performance.

While limited I/O IC packages can normally be easily packaged in leadframe type structures, higher I/O devices typically require more complex interconnection structures. These structures all serve to redistribute the fine pitch I/O of the IC chip to coarser pitches that are more manageable for interconnection at the next level of assembly such as when they are interconnected to a printed circuit board. While ceramic based interconnection structures are not uncommon, most users prefer reinforced organic materials for packaging ICs due to the lower dielectric constant and lower cost.

Present generation printed circuit based IC packaging technologies follow traditional design practices which typically involve the manufacture of monolithic substrates having one, two or more interconnection layers as required to redistribute the IC chip terminations to the more manageable pitch, while providing the best possible interconnection signal integrity. While there have been continuing advances to meet the needs of higher I/O devices, there remain limits to the performance potential of these solutions and it is not clear that the advances achieved will be capable of meeting the performance needs of next generation IC chips at reasonable costs and with reasonably short design cycles. For example, there are proposed solutions that involve total packaging of the IC on the wafer that include power, ground and redistribution wiring in the packaging elements that are bonded to the surface of the wafer. While attractive and offering the potential to reduce the number of I/O by managing, to a degree, the power and ground distribution inside the packaging portion of the completed structure, the manufacturing infrastructure is not yet prepared to deliver this type of solution because of the yield risks associated with assembly of a complete wafer.

Another challenge of present design practice is the management of circuit clocks which are vital to the efficient operation of the IC chip. Clock drivers are in normal practice integrated into the design of the IC chip. As such, they tend to be located in areas of convenience which often results in clock skew and timing errors that must be then addressed either using software or complex circuit routing solutions. Given the present challenges it is clear that there is opportunity and need for improvements which will address the gap between present approaches to and future requirements.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
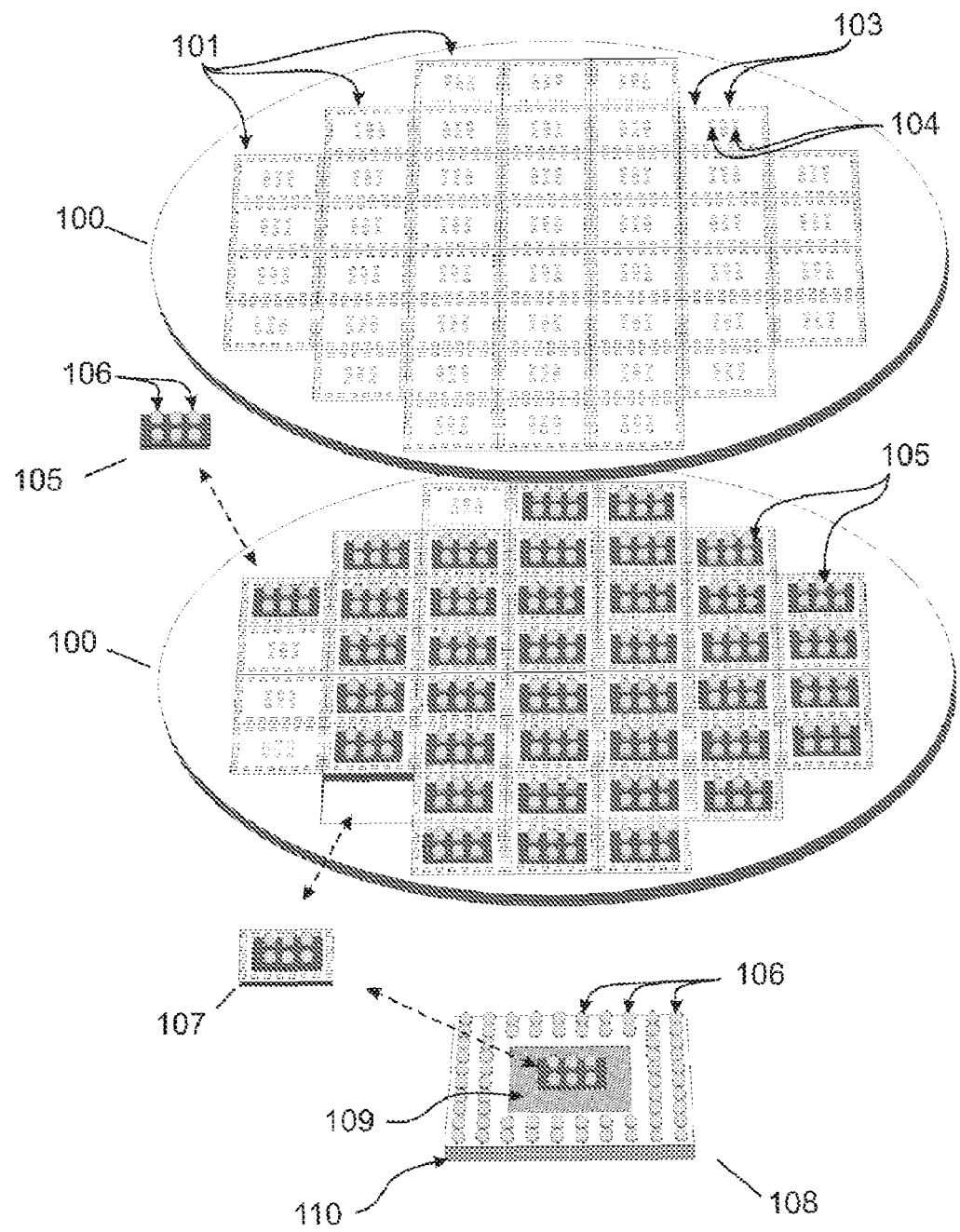
FIG. 1 illustrates exemplary steps for creating a partitioned IC package structure.

The present invention has come about in response to the problems occurring in the prior art. A first object of the present invention is to provide a semiconductor package in which the interconnection and packaging elements are partitioned into separate structures that are assembled and interconnected to the IC in separate steps. An example of such an embodiment would be a partial package that provides power, ground and cross chip interconnections which is mounted and interconnected on the face of the chip. The completed subassembly would then be made part of a second package element that would be used for signals and the chip interconnected to it. Thus the final assembly would have at least two separately constructed and interconnected packaging elements as a part of its final construction.

A second object of the present invention is to provide a semiconductor package structure that addresses the need for clock time control, accomplished by separating the clock functions from the chip and packaging them in a separate IC that is a part of the partitioned package interconnection structure. Alternatively, the clock driver chip can be packaged separately from the primary chip The present invention offers a novel alternative approach to addressing the stated problems by partitioning the IC package into pieces that allow the overall assembly process to separately address the needs of clock, power and ground in a sub-package while continuing to address the needs of high speed signals using more traditional or standard packaging methods. Moreover, it is also noted by the inventors, that a central clock driver chip can be enabled by these methods to further improve the performance of the IC package structure in operation.

The innovative concept comprises a the use of any of a number or alternative signal distribution structures for a semiconductor integrated circuit that provide for the distribution of clocks, power and grounds in a substrate or structure that is separate from, but proximate to the semiconductor chip.

Clocks, power, ground and signal I/O are all required circuit elements of an IC and all must reliably perform their functions. However, the distribution of these signals is impacted by increased resistivity, time delays and general skew differences and these degrading effects tend to increase with increases in the size of the IC chip and thus the advantages of large scale integration begins to quickly evaporate.

A solution to eliminating these particular problems lies just above a mass scale IC chip. By utilizing external signal paths, in conjunction with die bond wires or other interconnection media in non-standard ways, it is possible to distribute clocks, power and ground signals to alleviate the problems associated with on-die routing. Moreover a clock driver chip can be placed either on the chip or near to it in a manner that allows the clocks to be distributed from the center of the main chip to control the distribution of clock signals. This element of the invention may potentially be advantageously employed in standard packaging wherein a separate circuit with the central clock is attached to the surface of the chip and assembled. The figures provided help to better illustrate the invention.

FIG. 1 provides a series of perspective views of stages of assembly of an embodiment of the invention. In the figure a wafer 100 has a plurality of IC chips 101. Each of the IC chips has two sets of I/O terminals 103 and 104. The terminals located near the perimeter 103 are designed to serve the interconnection needs to the larger portion of the partitioned assembly 110, while the central terminals 104 are prepared to accept and be interconnected to the smaller portion of the partitioned assembly 105.

The first stage of assembly involves the placement and interconnection of the smaller portion of the assembly 105 onto the wafer as discrete elements, each having bumped contacts 106 such as solder balls. These discrete elements will desirably provide such functions as power and ground distribution, critical routes and clock distribution or any combination of these functions. While the illustration shows discrete elements 105 attached to the wafer, it is also possible to build the interconnection structure up directly on the surface of the wafer using a suitable process to improve process efficiency. In addition, while the bumps are shown to exist as the package elements are placed onto the IC chips, the bumps could be added after the second stage of assembly is complete.

The second stage of assembly involves the dicing of the wafer into discrete sub-assembled IC packages 107. The sub-assembled packages are placed into the larger partition portion of the package 110 and it is interconnected to the package to the peripheral terminals using a suitable method such as wire bonding (not shown) and the structure is then coated with a suitable encapsulant 109 to protect the chip and produce a completed portioned package assembly 108 having a set of bumps 106 for interconnection at the next level of assembly.

Figure 2:
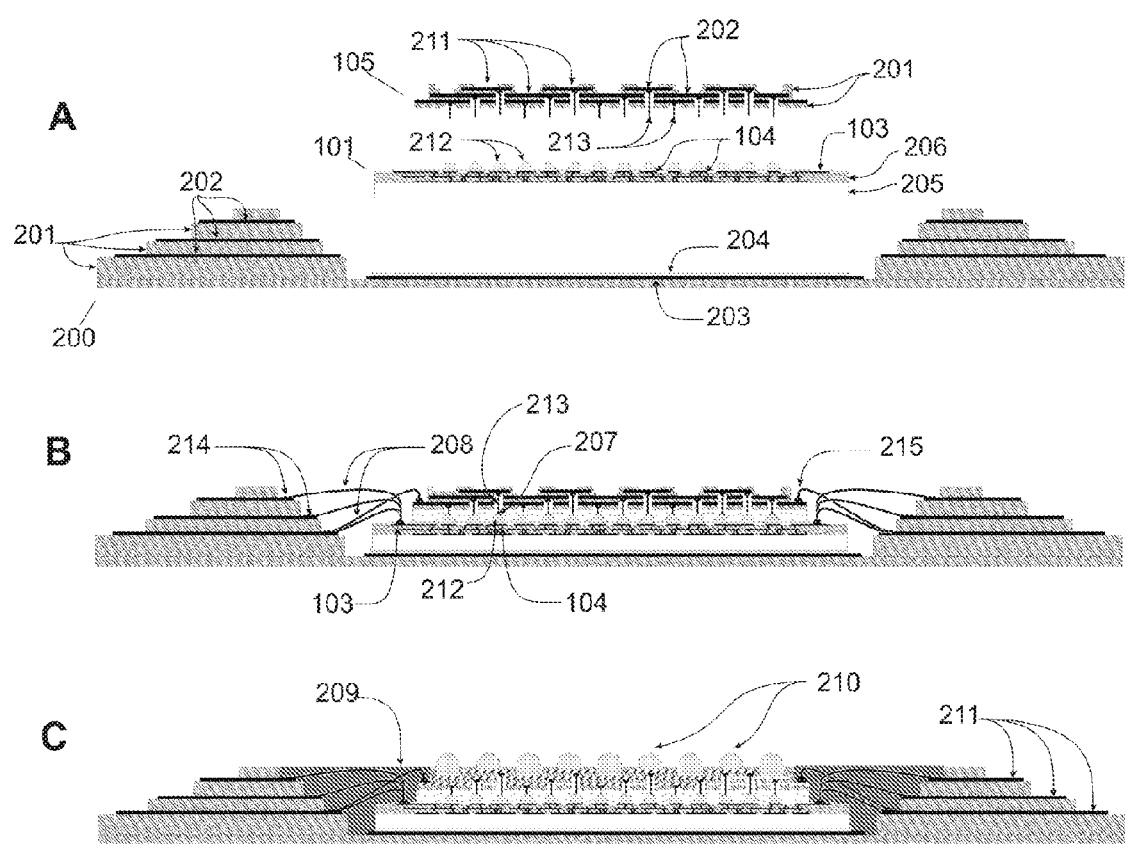
FIG. 2 illustrates detail of one embodiment of the structure.

FIG. 2 provides three cross sectional views of an embodiment of the invention. First in an exploded view, FIG. 2A, then with abbreviated assembly steps, FIG. 2B, and finally after an encapsulation step, FIG. 2C.

In FIG. 2A an IC chip 101 having a semiconductor base 205 and layers of circuitry 206 is illustrated with terminals near the perimeter 103 and in the central region 104. The central terminal are shown with bumps 212 that serve to facilitate interconnection to the smaller partition of the IC package assembly 105 comprising layers of insulation 201 and redistribution circuits 202 has apertures that serve next level interconnection on its upper surface 211. The structure 105 is shown in the embodiment with wires of differing length 213 interconnected to and protruding from cavities that provide interconnection to circuitry for power, ground cross chip routes and clock distribution or some combination thereof 202. The larger chip package structure 200, comprising insulating materials 201 and redistribution circuits 202 is illustrated having a metal bond pad 203 with a die attach adhesive 204.

FIG. 2B shows the interconnection of the elements of FIG. 2A with interconnections being made between wires 213 and central chip I/O terminations 104 with the bumps 212 to make electrical connections 207, while peripheral chip I/O terminals 103 are interconnected by wires 208 to the main body 200 at bond sites 214. In the illustration it is shown that it is possible to make connection from peripheral terminals 215 on the sub-assembly to the larger base partition of the assembly 200

FIG. 2C shows the embodiment in a potentially complete configuration with peripheral terminations for the next level assembly 211 illustrated in a stair stepped configuration and having bumps 210 also for termination to the next level assembly. An encapsulant 209 is employed to protect the wires and the exposed areas of the chip. While the larger chip package is illustrated in a stair-stepped configuration it is no so limited.

Figure 3:
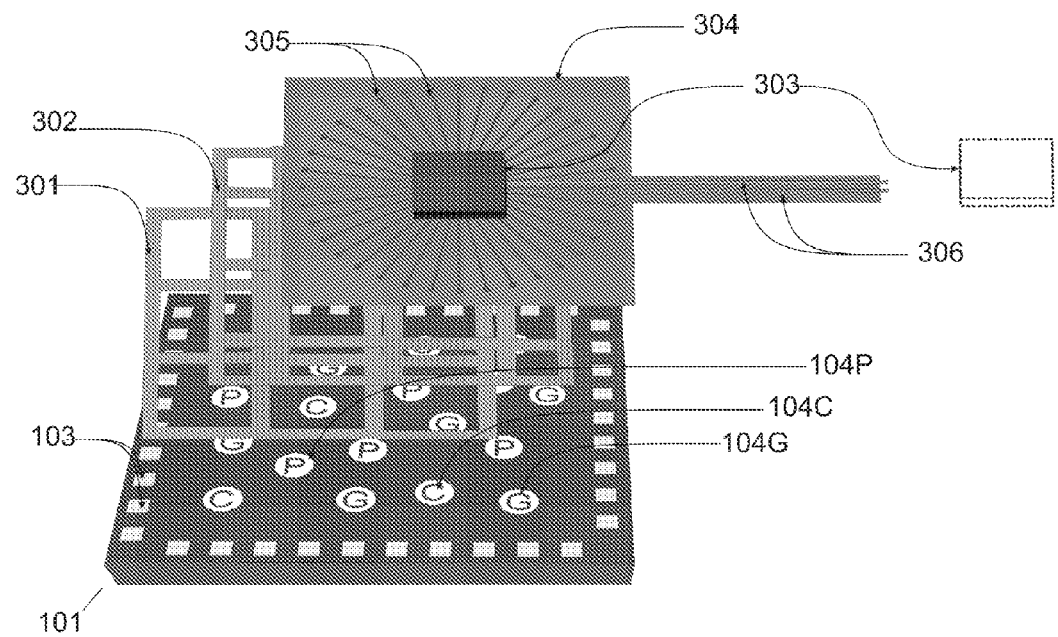
FIG. 3 illustrates a perspective view of an embodiment of the central clock with a power and ground distribution grid.

FIG. 3 illustrates an embodiment of the invention structure 105 showing an IC chip 101 having peripheral terminations 103 and central terminations 104P, 104G and 104C. 104P terminations are for power connections, 104G for ground connections and 104C for clock connections. A power grid 301 and ground grid 302 are interposed between the chip and the upper clock redistribution circuit. The insulation layers separating power and ground from each other and the clock layer is not shown for clarity. A clock chip 303 is shown mounted on the clock distribution circuit layer 304 with the clock circuits 305 emanating radially from the chip. Each clock circuit signal may be related or unrelated to each other. Clock chip 303 is shown in phantom form for clarity. The source of the clock chip timing may be supplied by the IC chip 101, by the clock chip itself 303 or from an external timing source. Traces 306 can be used to export clock signals for use by other ICs (not shown). Alternatively, traces 306 may be used as the input source of clock signals for clock chip 303 mounted on the clock distribution circuit layer 304 thereby allowing the circuitry on IC chip 101 to be synchronized to a clock source not generated on the IC chip 101. Although the clock circuits are shown emanating in a radial fashion, they may be routed in any direction to suite the requirements of the designer. To facilitate better signal quality on the clock distribution layer, passive termination electronic components may be arranged on, or within the clock distribution layer at, or near, the termination points of the signals where they attach 104C to the IC chip 101. Clock chip 303 may be hardwired, one-time or many time programmable to adjust the phase relationship between each of the clock circuits 305. The power and ground connections required by the clock chip 303 may be supplied by the same power grid 301 and ground grid 302 as the IC chip 101 or alternatively the power supplied to the clock chip 303 may be supplied by separate power and ground grids to minimize power supply noise. Signal traces 306 are shown as a permanent attachment to the clock distribution circuit layer but may alternatively be detachable through suitable means. All elements are shown above the chip to which they will be interconnected for power ground and clock or other interconnections.

Figure 4:
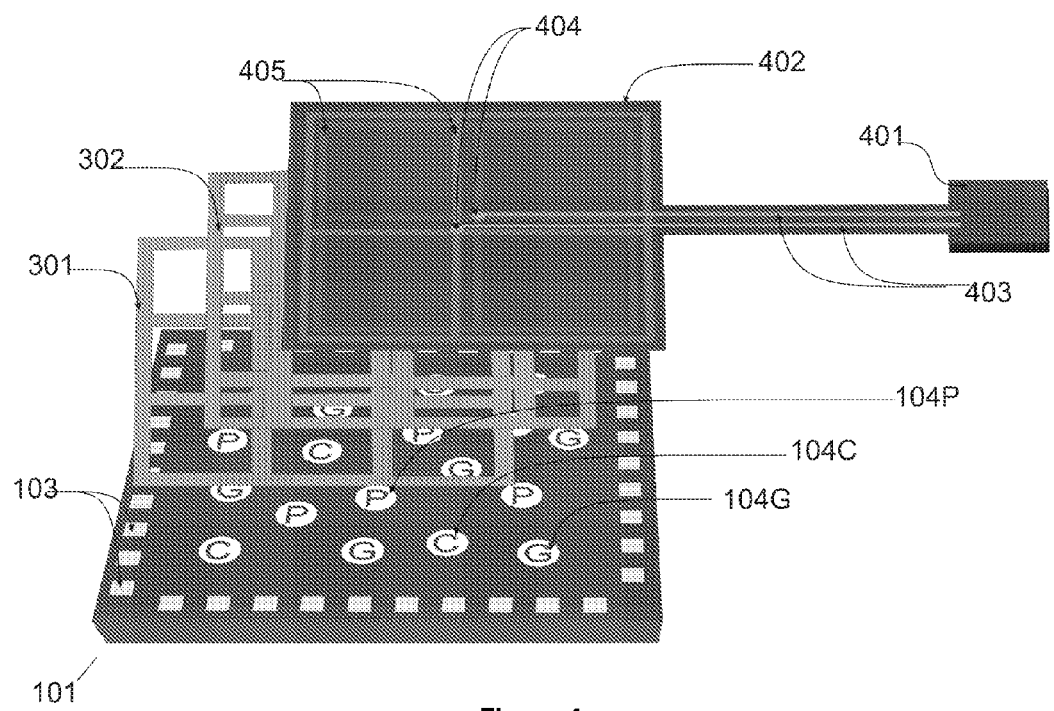
FIG. 4 illustrates a perspective of another embodiment of a central clock with a power and ground distribution grid.

FIG. 4 illustrates an alternative embodiment of the invention structure 105 showing and IC chip 101 having peripheral terminations 103 and central terminations 104P, 104G and 104C. 104P terminations are for power connections, 104G for ground connections and 104C for clock connections. A power grid 301 and ground grid 302 are interposed between the chip and the upper clock redistribution circuit. The insulation layers separating power and ground from each other and the clock layer is not shown for clarity. A clock chip 401 is shown distal from the clock distribution circuit layer 402. In this embodiment the clock circuits 403 arrive at the center of the clock distribution circuit layer 402 and are distributed from the center 404 of the clock distribution layer to a clock distribution ring 405. Alternatively, clock signals may be distributed, from the center radially without a ring, as illustrated in FIG. 3. The clock distribution ring may be of any size and shape. One benefit of a ring topology is the reduction or elimination of stubs, All elements are shown above the chip to which they will be interconnected for power ground and clock or other interconnections.

In each of foregoing embodiments it is anticipated that the testing of sorted, unpackaged IC devices 101 will require special considerations since power, ground and clock terminals may require special test probe setup. To alleviate the problem, it is anticipated that power 104P and grounds 104G connections on the IC device 101 may be electrically connected to each other, respectively within the interconnect structure of the IC devices 101 thus easing the burden of probe attaché for low current testing. The addition of the power and ground grids provides for higher speed testing. It is also anticipated that each of the clock connections 104C may have circuitry to drive them from within the IC chip 104 during bare die testing but these drivers are disabled once a clock distribution circuit layer is added.

Although the invention has been described briefly with reference to specific exemplary embodiments thereof, it will be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An integrated circuit (IC) package assembly comprising a subassembly that includes:
   a) an IC die with a first surface having a central surface region, a peripheral surface region extending from the central surface region to a periphery of the first surface, and a plurality of central terminals disposed on the central surface region; and
   b) a first interconnection redistribution substrate having redistribution circuitry required for the operation of the IC die and a plurality of conductive wires electrically coupled with a corresponding central terminal to form a subassembly, said interconnection redistribution substrate having planar dimensions less than those of the first surface of the IC die such that at least some of the peripheral surface region of the first surface is exposed.

2. The integrated circuit (IC) package assembly of claim 1, wherein the redistribution circuitry is selected from among a group of circuits consisting of cross-chip circuits configured to couple first and second electrical elements within said IC die, power distribution circuits, clock distribution circuits, ground distribution circuits, and combinations thereof.

3. The integrated circuit (IC) package assembly of claim 1 further comprising a second interconnection redistribution substrate electrically interconnected with the subassembly.

4. The integrated circuit (IC) package assembly of claim 3 further comprising a plurality of peripheral terminals disposed on the peripheral surface region of the subassembly, a plurality of conductive bond sites disposed on said second interconnection redistribution substrate, and a first plurality of wire bonds, each of the first plurality of wire bonds coupling a peripheral terminal to a corresponding conductive bond site.

5. The integrated circuit (IC) package assembly of claim 4 wherein the second interconnection redistribution substrate comprises a plurality of parallel surfaces forming at least one stairstep formation, and wherein the first plurality of bond sites are disposed on at least two of said plurality of parallel surfaces forming said at least one stairstep formation.

6. The integrated circuit (IC) package assembly of claim 5 wherein the second interconnection redistribution substrate further comprises a metal bond pad, and wherein the subassembly is disposed on the metal bond pad.

7. The integrated circuit (IC) package assembly of claim 6 further comprising a die attach adhesive formed on the metal bond pad and coupling the subassembly thereto.

8. The integrated circuit (IC) package assembly of claim 6 wherein the metal bond pad is disposed on a layer that extends to form a bottom layer within said at least one stairstep formation.

9. The integrated circuit (IC) package assembly of claim 8 wherein said at least stairstep formation includes facing stairstep regions that form a stairstep well between said facing stairstep regions, and wherein said subassembly is disposed within said stairstep well.

10. The integrated circuit (IC) package assembly of claim 4 wherein the redistribution substrate further comprises apertures having conductive members disposed therein.

11. The integrated circuit (IC) package assembly of claim 10 further comprising a second plurality of bond wires, at least one of the second plurality of bond wires electrically coupling one of the conductive members within an aperture to a bond site on said at least one stairstep formation.

12. The integrated circuit (IC) package assembly of claim 4 wherein the plurality of conductive wires that couple the first redistribution substrate to the first IC die comprise at least two different lengths of conductive wire.

* * * * *